United States Patent [19]

Corn et al.

[11] Patent Number: 4,585,516
[45] Date of Patent: Apr. 29, 1986

[54] VARIABLE DUTY CYCLE, MULTIPLE FREQUENCY, PLASMA REACTOR

[75] Inventors: Glenn R. Corn, Sausalito; Andreas G. Hegedus, Albany, both of Calif.

[73] Assignee: Tegal Corporation, Novato, Calif.

[21] Appl. No.: 707,639

[22] Filed: Mar. 4, 1985

[51] Int. Cl.⁴ ............... H01L 21/306; B44C 1/22; C03C 15/00; C03C 25/06
[52] U.S. Cl. .................... 156/643; 156/626; 156/646; 156/345; 204/192 E; 204/298
[58] Field of Search ............ 156/345, 643, 646, 626; 204/164, 192 EC, 192 E, 298; 427/38, 39; 118/50.1, 620, 728

[56] References Cited

U.S. PATENT DOCUMENTS 4,464,223  8/1984  Gorin .......................... 156/643
4,500,563  2/1985  Ellenberger ................. 427/38

FOREIGN PATENT DOCUMENTS 0033839  4/1981  Japan ........................ 156/345
0186937  11/1983  Japan .

Primary Examiner—William A. Powell
Attorney, Agent, or Firm—Paul F. Wille

[57] ABSTRACT

A plasma reactor and a process for operating a plasma reactor are disclosed. The reactor comprises parallel plates in which one plate is connected to a source of high frequency signal and a second plate is connected to a source of low frequency signal. Control apparatus modulates one or both signals. In the process, the duty cycles of the modulating signals is controlled so that the signals overlap during at least a portion of their cycles.

7 Claims, 2 Drawing Figures

VARIABLE DUTY CYCLE, MULTIPLE FREQUENCY, PLASMA REACTOR

This invention relates to an improved plasma reactor apparatus and method and, in particular, to a multiple frequency plasma reactor in which the frequencies are modulated in amplitude.

Plasma reactors are being used more widely in the semiconductor industry. In part, this is due the fact that it is a "dry" chemical apparatus, as opposed to "wet" chemical apparatus, e.g. for etching, which greatly simplifies the manufacturing environment. While providing improved etch selectively, dimensional control, selectivity, and process flexibility, these advantages are often achieved by a careful balancing of process parameters.

In the particular use of a plasma reactor as apparatus for etching semiconductor wafers, one is concerned with etch rate, uniformity, selectivity, etch profile, and the removal of etch products. Here again, one is typically confronted with a number of trade-offs or compromises which must be made, for example between etch rate and uniformity. To the extent any one of these parameters can be improved, greater freedom is provided in the operation of the apparatus and in the results obtainable.

It is known in the art to apply more than one RF signal to a plasma reactor; e.g. see U.S. Pat. No. 4,464,223. It is also known in the art to alternately apply a high frequency signal and a low frequency signal to a plasma reactor; e.g. see Japanese laid-open patent No. 186937/1983. While these patents have as their goal the improvement of a plasma etch cycle, it remains that this function could be further enhanced.

In view of the foregoing, it is therefore an object of the present invention to improve the etching capability of plasma reactor apparatus.

Another object of the present invention is to provide an improved plasma etch process using at least two sources of RF power.

A further object of the present invention is to provide an improved etch process in which two sources of RF power have different duty cycles.

It is another object of the present invention to provide an improved etch process in which the applied RF signals are modulated so that at least one signal has a duty cycle less than one hundred percent and is applied simultaneously with the other signal during at least a portion of that cycle.

The foregoing objects are achieved in the present invention wherein a source of high frequency signal and a source of low frequency signal are each connected to a plasma reactor by way of a modulator. Control means are connected to each modulator for controlling the operation thereof. Either or both signals may be modulated. The signals are modulated in such a way that the duty cycles of the signals overlap.

A more complete understanding of the present invention can be obtained by considering the following detailed description in conjunction with the accompanying drawings, in which.

In the customary terminology used by those of skill in the art, a "high frequency" is any frequency greater than about 10 MHz, while a "low frequency" is any frequency less than about 1 MHz. As is known in the art, the frequency of the RF power applied to a reactant gas determines to some extent the characteristics of the plasma that is generated with that gas. In general, the amount of dissociation of the gas that occurs varies with frequency, i.e. the dissociation remains low until the applied frequency exceeds about 10 MHz. Conversely, the enrgy of the ion generated in the plasma varies inversely with frequency, i.e. the ion energy is high at low frequencies and low at high frequencies.

Figure 1:
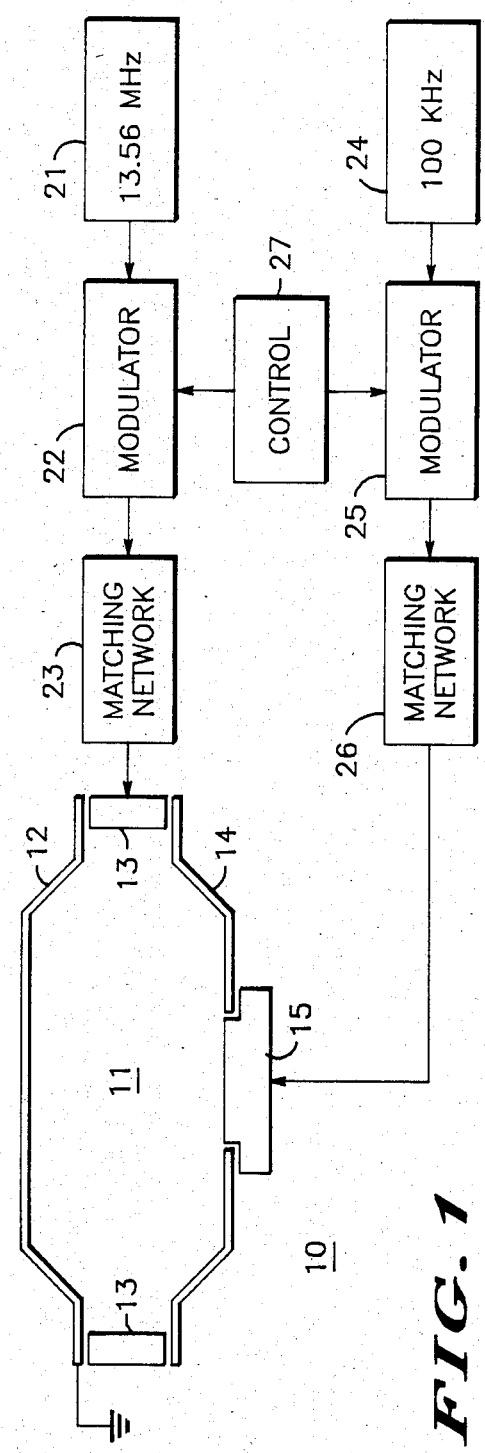
FIG. 1 illustrates a preferred embodiment of a plasma reactor in accordance with the present invention.

While energy and dissociation are not the only factors to be considered in designing a process for a plasma reactor, these factors have a strong influence on, for example, etch uniformity and etch rate. In accordance with the present invention, as illustrated in FIG. 1, an apparatus is provided for controlling the signals applied to the reactor to obtain optimum characteristics within the plasma. In particular, the plasma reactor equipment comprises a chamber 10 having an upper electrode 12, a central electrode 13, and a lower electrode 14. Positioned within lower electrode 14 is wafer chunk 15. Suitable sealing members, not shown, interconnect these elements to define a closed chamber 11 into which gas is introduced for processing wafers. Electrodes 12, 13, and 14 are electrically isolated from each other. In a preferred embodiment of the present invention, upper electrode 12 is grounded, middle electrode 13 receives an RF signal of a first frequency and lower electrode 14 receives an RF signal of a second frequency. Wafer chuck 15 and lower electrode 14 are typically electrically connected although they need not be, depending upon the particular construction of the plasma reactor.

In accordance with the present invention, two of the electrodes are driven by respective RF signals of which at least one is modulated to provide a duty cycle of less than one hundred percent. In particular, source 21 provides an RF signal at a frequency of 13.56 MHz, the frequency allocated by the Federal Communications Commission of the United States Government. The signal from source 21 is coupled through modulator 22 and matching network 23 to middle electrode 13. Similarly, source 24 provides a signal at a frequency of 100 KHz, which is coupled through modulator 25 and matching network 26 to wafer chuck 15. Control means 27 is electrically connected to modulators 22 and 25 for controlling the operation thereof. In particular, control means 27 provides a suitable signal for amplitude modulating the signals from sources 21 and 24, respectively.

Figure 2:
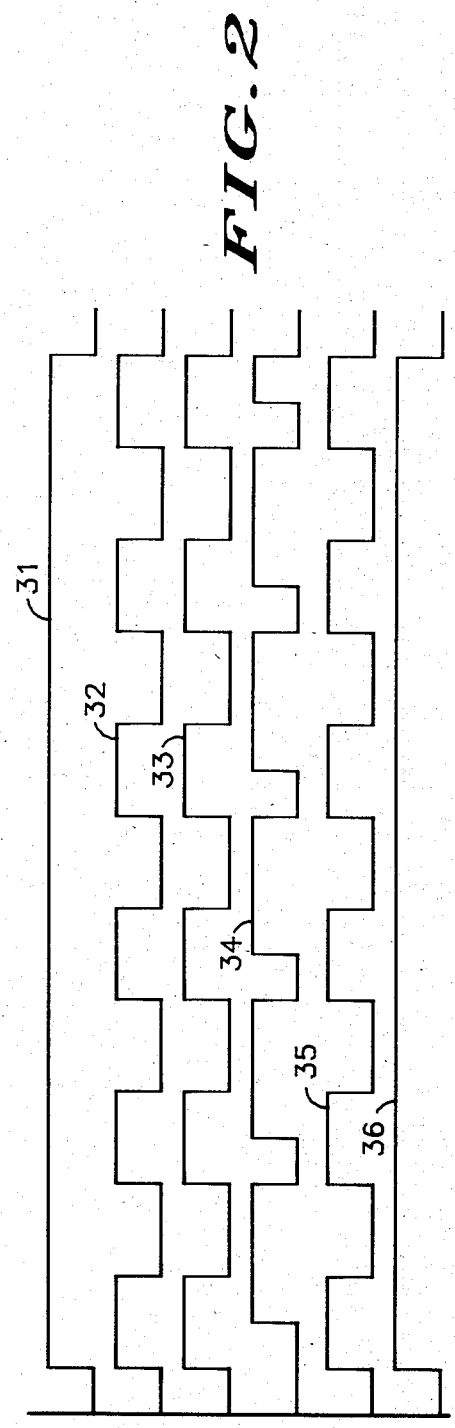
FIG. 2 illustrates waveforms useful in understanding the operation of the present invention.

A more detailed understanding of the operation of control means 27 can be obtained by considering the waveforms of FIG. 2. In particular, FIG. 2 illustrates three pairs of waveforms representing the control signal to modulators 22 and 25, respectively. Wavefom 31 and 32 represent the signals to modulators 22 and 25, respectively. As illustrated in FIG. 2 the process is initiated and the 13.56 MHz signal from souce 21 is continuously applied to electrode 13. Meanwhile, the 100 KHz signal from source 24 is turned on and off by modulator 25 at some suitable rate, e.g. no more than one-tenth the frequency of source 24.

While curve 32 could be construed as illustrating a waveform of a fifty percent duty cycle, it is understood by those of skill in the art that this is by way of example only to illustrate a waveform having a duty cycle of less than one hundred percent. As known by those of skill in the art, "duty cycle" refers to the fraction, expressed as a percent, per unit time that a signal is "on" or applied to a load. Thus, a signal that is applied to a load one-half the time has a fifty percent duty cycle.

In an alternative embodiment of the present invention, curves 33 and 34 represent the control signals to modulators 22 and 25, respectively. In this embodiment, the high frequency signal has an approximately fifty percent duty cycle while the low frequency signal has a higher percentage duty cycle so that the signals are simultaneously applied to the chamber at least part of the time. Both signals are modulated, thereby separately controlling the dissociation and ion energy within the plasma.

In another alternative embodiment, the ion energy is relatively fixed while the dissociation is varied by controlling the duty cycle. Curves 35 and 36 represent controls signals applied to modulators 22 and 25, respectively, in a third embodiment of the present invention. In this embodiment, the low frequency signal is what is known as continuous wave while the high frequency signal is modulated. Each of these three embodiments produce different plasma characteristics by virture of the average power applied for the high frequency and low frequency signals. Thus, one can tune the plasma reaction to the particular task at hand.

A process for etching a silicon dioxide layer, for example, in accordance with the present invention comprises placing a wafer on wafer chuck 15 and moving wafer chuck 15 into position as shown in FIG. 1. to seal chamber 11. Chamber 11 is then flushed with a suitable gas, such as nitrogen, after which the reactant gas or gas mixture is supplied to chamber 11 by any suitable means, not shown. It is understood that the chamber is also evacuated, thereby maintaining a suitably low pressure within chamber 11 and a flow of gas around and about the wafer upon chuck 15. Control means 27 supplies suitable signals to modulators 22 and 25 enabling them to apply the high and low frequency signals, respectively, to matching networks 23 and 26. At least one of the signals is modulated as illustrated in FIG. 2 for a time period suitable for completing the etch. Upon completion of the etch, which may be detected by an end point detector, known per se in the art, or by simply the passage of time, control means 27 terminates the signals from sources 21 and 24 through modulators 22 and 25. At this point the wafer can be removed or the reactive gas or gas mixture can be changed to accomplish the next step in the processing of the wafer.

A more specific example of the present invention is contained in the following table. The etched material was a layer of polycrystalline silicon on a wafer having a diameter of four inches (one hundred millimeters). The etch rate is in nanometers per minute. The high frequency signal comprised 13.56 MHz at four hundred watts, continuous wave. The pressure within the reactor was two hundred fifty millitorr (33 Pa).

| $CF_4$ Gas (sccm) | $Cl_2$ Gas (sccm) | Duty Cycle | 100 KHz Avg. Pwr. (peak) | Etch rate | Uniformity |
|---|---|---|---|---|---|
| 12 | 3 | 0% | 0 (0) | 30 | 7% |
|  |  | 10% | 10 (100) | 83 | 9% |

-continued

| $CF_4$ Gas (sccm) | $Cl_2$ Gas (sccm) | Duty Cycle | 100 KHz Avg. Pwr. (peak) | Etch rate | Uniformity |
|---|---|---|---|---|---|
|  |  | 25% | 10 (40) | 98 | 13% |
|  |  | 50% | 10 (20) | 158 | 4% |
|  |  | 100% | 10 (10) | 288 | 5% |
| 24 | 6 | 50% | 5 (10) | 333 | 18% |
|  |  | 50% | 10 (20) | 275 | 5% |
|  |  | 50% | 15 (30) | 288 | 4% |
| 24 | 6 | 25% | 10 (40) | 265 | 6% |
|  |  | 50% | 10 (20) | 270 | 5% |
|  |  | 100% | 10 (10) | 277 | 7% |

As shown by the preceding, one can obtain both high etch rates and good uniformity by varying duty cycle. As also shown by the preceding, the duty cycle is not the only parameter to be considered, e.g. the rate of flow of the gas also affects the etch rate. It remains, however, that the improved control obtained from the present invention broadens the tolerances of other process parameters.

It will be apparent to those of skill in the art that various modifications can be made within the spirit and scope of the present invention. For example, the matching networks 23 and 26 can be suitably combined so that the high and low frequency signals are applied to a common electrode. Similarly, the particular electrodes chosen for connection to sources 21 and 24 can be changed from those illustrated in FIG. 1.

We claim:

1. Plasma reactor apparatus comprising:
   first, second and third electrodes defining an enclosed volume for receiving an article to be treated;
   a source of high frequency signal;
   a source of low frequency signal; and
   means for selectively connecting said source of high frequency signal to one electrode and said source of low frequency signal to another electrode;
   said means comprising control means for modulating the amplitude of said signals so that at least one of said signals has a duty cycle of less than one hundred percent.

2. Plasma reactor apparatus at set forth in claim 1 wherein said means comprises control means for modulating both of said signals so that said signals each have a duty cycle of less than one hundred percent.

3. A process for treating semiconductor wafers in a plasma reactor comprising the steps of:
   applying a high frequency signal to a plasma reactor chamber;
   applying a low frequency signal to said plasma reactor chamber;
   supplying a reactant gas to said chamber; and
   modulating at least one of said signals so that the duty cycle of the signal is less than one hundred percent.

4. The process as set forth in claim 3 wherein both of said signals are modulated.

5. The process as set forth in claim 4 wherein said signals are modulated by modulating signals having the same frequency.

6. The process as set forth in claim 5 wherein said modulating signals have different duty cycles.

7. The process as set forth in claim 6 wherein said modulating signals have duty cycles such that high and low frequency signals are not simultaneously turned off during said process.

* * * * *